US010971242B2

(12) United States Patent
Huott et al.

(10) Patent No.: US 10,971,242 B2
(45) Date of Patent: Apr. 6, 2021

(54) SEQUENTIAL ERROR CAPTURE DURING MEMORY TEST

(71) Applicant: International Business Machines Corporation, Armonk, NY (US)

(72) Inventors: William Huott, Holmes, NY (US); Daniel Rodko, Poughkeepsie, NY (US); Pradip Patel, Poughkeepsie, NY (US)

(73) Assignee: INTERNATIONAL BUSINESS MACHINES CORPORATION, Armonk, NY (US)

( * ) Notice: Subject to any disclaimer, the term of this patent is extended or adjusted under 35 U.S.C. 154(b) by 0 days.

(21) Appl. No.: 16/567,508

(22) Filed: Sep. 11, 2019

(65) Prior Publication Data

US 2021/0074375 A1    Mar. 11, 2021

(51) Int. Cl.
*G11C 29/12* (2006.01)
*G11C 29/02* (2006.01)
*G11C 29/44* (2006.01)
*G11C 29/00* (2006.01)

(52) U.S. Cl.
CPC ............ *G11C 29/12* (2013.01); *G11C 29/025* (2013.01); *G11C 29/44* (2013.01); *G11C 29/789* (2013.01); *G11C 29/86* (2013.01)

(58) Field of Classification Search
CPC .................................................... G11C 29/12
See application file for complete search history.

(56) References Cited

U.S. PATENT DOCUMENTS 5,659,551 A    8/1997  Huott et al.
6,182,257 B1   1/2001  Gillingham
6,374,370 B1   4/2002  Bockhaus et al.
6,643,807 B1   11/2003 Heaslip et al.
6,950,974 B1   9/2005  Wohl
7,237,162 B1   6/2007  Wohl
(Continued)

OTHER PUBLICATIONS

Cheng, Allen. Comprehensive Study on Designing Memory BIST: Algorithms, Implementations and Trade-Offs. EECS 579, Fall 2002. Digital System Testing Project Report. Advanced Computer Architecture Lab. Department of Eletrical Engineering and Computer Science. The University of Michigan. Ann Arbor, MI 48109-2122. Dec. 16, 2002, 34 Pages.

(Continued)

*Primary Examiner* — Joseph D Torres
(74) *Attorney, Agent, or Firm* — Cantor Colburn LLP; William Kinnaman

(57) ABSTRACT

Embodiments of the present invention are directed to methods, systems, and circuitry for memory arrays. A system for testing a memory array having self-test circuitry includes a register having register latches operable to receive error logic signals having respective first states or second states. The register latches are arranged in series having respective latch inputs cascaded with preceding latch outputs operable to shift the error logic signals to a serial output according to a control signal that is common to the register latches. The system includes an aggregate latch operable to receive the serial output and having input logic configured to maintain a first state of the aggregate latch until the serial output is a second state. The system includes a built-in self-test (BIST) engine including stored instructions operable upon execution by the BIST engine to output the control signal.

11 Claims, 3 Drawing Sheets

(56) References Cited

U.S. PATENT DOCUMENTS

| | | | |
|---|---|---|---|
| 7,269,766 B2 | 9/2007 | Slobodnik et al. | |
| 7,304,875 B1 | 12/2007 | Lien | |
| 7,973,549 B2 | 7/2011 | Joshi et al. | |
| 8,327,207 B2 | 12/2012 | Duffy et al. | |
| 2002/0138801 A1* | 9/2002 | Wang | G01R 31/31705 714/729 |
| 2004/0117694 A1* | 6/2004 | Howlett | G11C 29/848 714/710 |
| 2005/0160316 A1 | 7/2005 | Shipton | |
| 2006/0156117 A1* | 7/2006 | Maruyama | G06F 11/27 714/726 |
| 2008/0016418 A1 | 1/2008 | Evans et al. | |
| 2010/0275014 A1 | 10/2010 | Kelley | |
| 2011/0055646 A1 | 3/2011 | Mukherjee | |
| 2013/0159799 A1 | 6/2013 | Brown | |

OTHER PUBLICATIONS

List of IBM Patents or Patent Applications Treated As Related; Date Filed: Sep. 12, 2019, 2 Pages.

Saman Adham & Benoit Nadeau-Dostie. A BIST Algorithm for Bit/Group Write Enable Faults in SRAMs. Records of the 2004 International Workshop on Memory Technology, Design and Testing. 2004. 4 Pages.

William Huott, "Built-In Self-Test for Bit-Write Enabled Memory Arrays", U.S. Appl. No. 16/567,495, filed Sep. 12, 2019—Docket No. P201904009US01.

Transmittal Form PTO/SB/21, signed Mar. 17, 2020.

* cited by examiner

SEQUENTIAL ERROR CAPTURE DURING MEMORY TEST

BACKGROUND

The present invention relates to built-in self-test (BIST) circuitry for memory arrays, and more specifically, to the use of error condition handling of BIST enabled memory arrays.

SUMMARY

Embodiments of the present invention are directed to methods, systems, and circuitry for memory arrays. A system for testing a memory array having self-test circuitry includes a register having register latches operable to receive error logic signals having respective first states or second states. The register latches are arranged in series having respective latch inputs cascaded with preceding latch outputs operable to shift the error logic signals to a serial output according to a control signal that is common to the register latches. The system includes an aggregate latch operable to receive the serial output and having input logic configured to maintain a first state of the aggregate latch until the serial output is a second state. The system includes a built-in self-test (BIST) engine including stored instructions operable upon execution by the BIST engine to output the control signal.

Embodiments also include a method of checking for memory errors in a memory array. The method includes sending test representations having respective first states or second states to a memory array having memory cells under test. The method includes storing error logic signals having first states or second states based on a comparison of the test representations with logical representations having respective first states or second states from the memory array in register latches. The method includes operating the register latches with a control signal to shift the error logic signals stored in the register latches to a serial output. The method also includes operating an aggregate latch with the control signal to maintain the first state until the serial output is the second state.

Embodiments further include a computer program product for testing one or more memory cells of a memory array comprising self-test circuitry. The computer program product includes a built-in self-test (BIST) engine comprising a digital storage device. The digital storage device includes stored instructions operable upon execution by a processor to send a plurality of test representations to the memory array comprising the one or more memory cells configured to receive the plurality of test representations and output a plurality of logical representations having respective first states or second states based on the plurality of test representations. The digital storage device includes stored instructions operable upon execution by a processor to send the plurality of test representations to comparator circuitry configured to compare the plurality of logical representations from the memory array and the plurality of test representations from the BIST engine and a plurality of output error logic signals. The digital storage device includes stored instructions operable upon execution by a processor to output a control signal operable to shift the plurality of error logic signals corresponding with respective memory cells as received by register latches being arranged in series having respective latch inputs cascaded with preceding latch outputs to an aggregate latch.

Additional technical features and benefits are realized through the techniques of the present invention. Embodiments and aspects of the invention are described in detail herein and are considered a part of the claimed subject matter. For a better understanding, refer to the detailed description and to the drawings.

BRIEF DESCRIPTION OF THE DRAWINGS

The subject matter which is regarded as the invention is particularly pointed out and distinctly claimed in the claims at the conclusion of the specification. The forgoing and other features, and advantages of the invention are apparent from the following detailed description taken in conjunction with the accompanying drawings in which:

DETAILED DESCRIPTION

Computers include computer readable mediums including memory arrays having memory cells or segments. A built-in self-test (BIST) engine may be configured to test the memory arrays for defects and faults. For example, a cell or group of cells located within the array may be unable to properly read or write data. The BIST engine may test for functional errors specific to the memory array. Logical values stored on the memory array may be compared with intended values to generate error values. Repair circuitry may use the compared output to determine which areas of the memory array have a defect. A register may shift the error values directly to the repair circuitry, reducing the overall footprint of the self-testing system.

Figure 1:
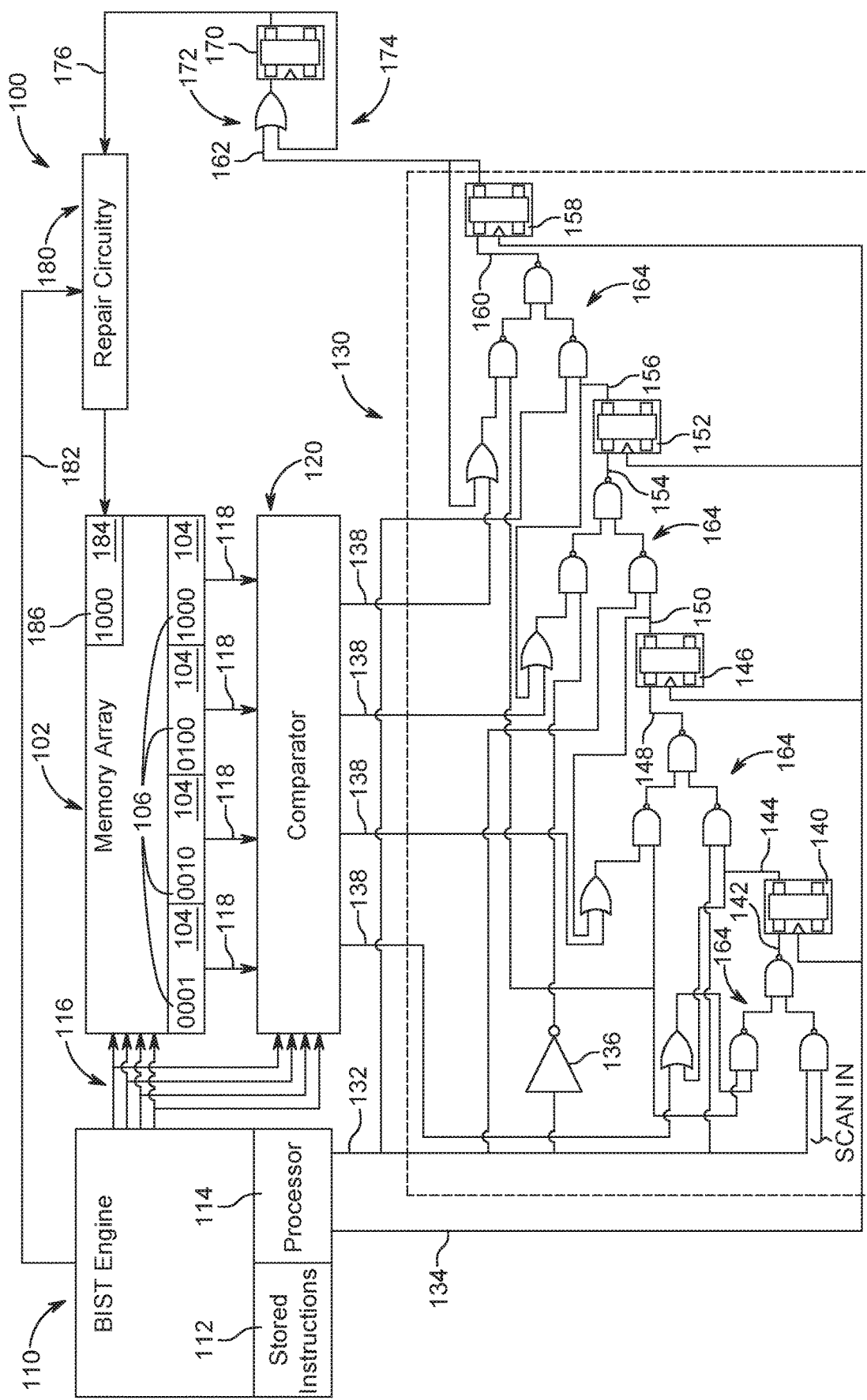
FIG. 1 illustrates a block diagram of a system including a built-in self-test (BIST) engine in accordance with one or more embodiments of the present invention.

Referring to FIG. 1, a system 100 is shown. The system 100 includes a memory array 102. The memory array 102 may be any type of memory storage device. As an example, the memory array 102 may be static random-access memory (SRAM), dynamic random-access memory (DRAM), or any other system of cells, latches, flip-flops, or devices configured to retain logical data. The memory array 102 can include individual memory cells 104 associated with respective memory addresses 106. It should be appreciated that any number of memory cells 104, memory addresses 106, and data buses associated therewith may be used to read data from the memory array 102 and write data to the memory array 102. The memory array 102 is configured to output logical representations 118.

The BIST engine 110 includes stored instructions 112. The stored instructions 112 may be defined in hardware logic, memory storage, or any other implement appreciated by those having skill in the art. The stored instructions 112 may be executed by a processor 114. The processor 114 may be any type of processing implement. The stored instructions 112 may include test data as test representations to send to the memory array 102 through the test representations 116. As an example, the test data may include data that is entirely one logic (e.g., TRUE) or another logic (e.g., FALSE). The test data may include functionally defined data based on algorithms, randomly generated data, or combinations thereof. The test data may be represented as vectors configured to travel on buses or bit paths conveying the entire vector or portions thereof. The test representations 116 can be derived from hardcoded keys or initialized during manufacture. The BIST engine 110 and the memory array 102 may be implemented on the same printed circuit board, integrated circuit, or other substrate, e.g., within a single chip. In one or more other embodiments, the BIST engine 110 and the memory array 102 are disposed on disparate substrates.

The BIST engine 110 also sends the test representations 116 to the comparator 120. The comparator 120 may include XOR configurations or other implements to determine inconsistencies between the logical representations 118 from the memory array 102 and the test representations 116 from the BIST engine 110. The comparator 120 outputs error logic signals 138.

The system 100 includes a register 130. The register 130 may be any kind of registry device that includes cells, latches, flip-flops, or devices configured to retain logical data. The register 130 includes register latches 140, 146, 152, 158. The register latches 140, 146, 152, 158 may be any type of device configured to retain logical data, including flip-flops. The register latches 140, 146, 152, 158, as shown, are configured to receive the error logic signals 138 from the comparator 120. The register latches 140, 146, 152, 158 are cascaded in serial. That is, the register latches 140, 146, 152, 158 have respective latch inputs 142, 148, 154, 160 cascaded with previous latch outputs 144, 150, 156 to serial output 162 such that each of the error logic signals 138 are sequentially transferred to the serial output 162.

Figure 3:
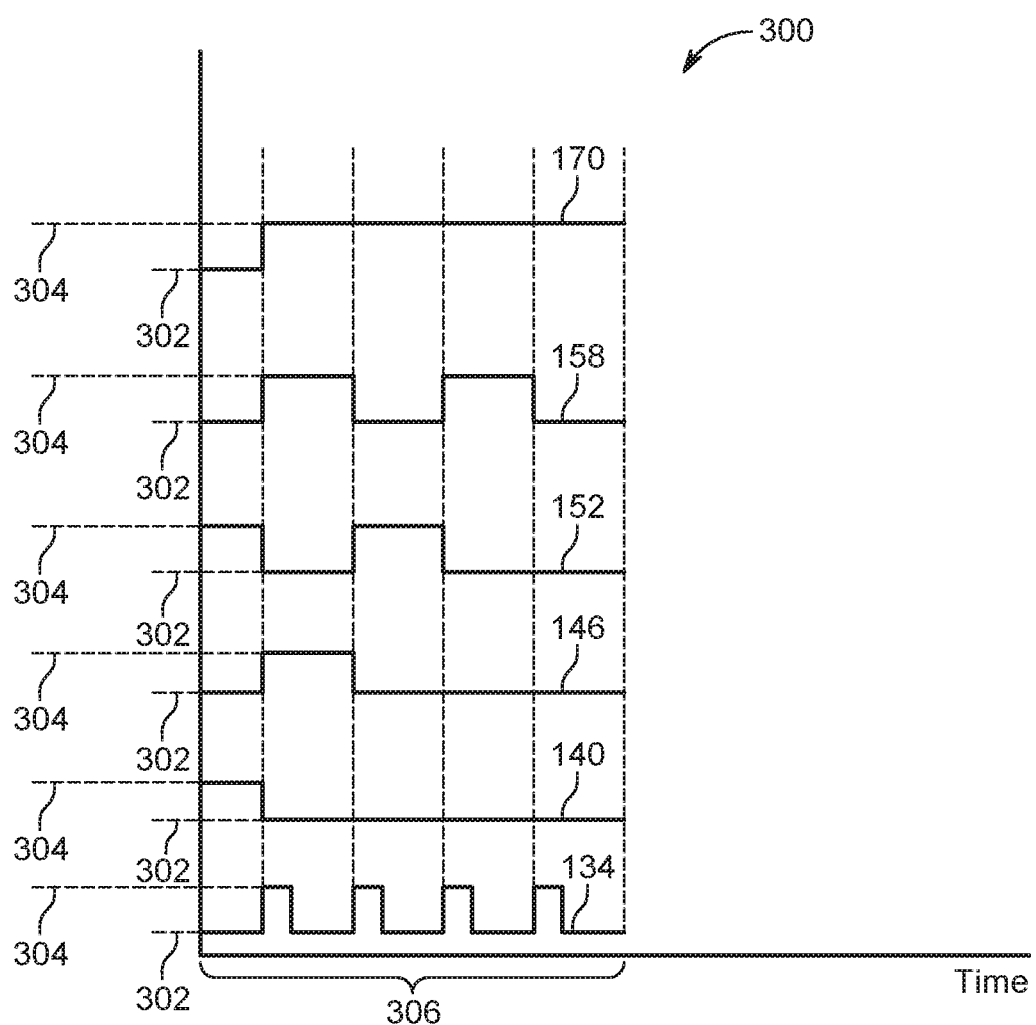
FIG. 3 illustrates a timing diagram for a control signal associated with the BIST engine in accordance with one or more embodiments of the present invention.

The serial output 162 is associated with an aggregate latch 170. The aggregate latch 170 is operable to receive the serial output 162. The aggregate latch 170 includes input logic 172. The input logic 172 may be configured to maintain a first state 302, as shown in FIG. 3, until the serial output 162 is a second state 304. The input logic 172 includes a feedback loop 174 from the aggregate latch output 176. As one example, the input logic 172 is an OR gate that receives the serial output 162 as an aggregate serial input and the feedback loop 174, maintaining the first state 302, until the serial output 162 is a second state 304.

Figure 4:
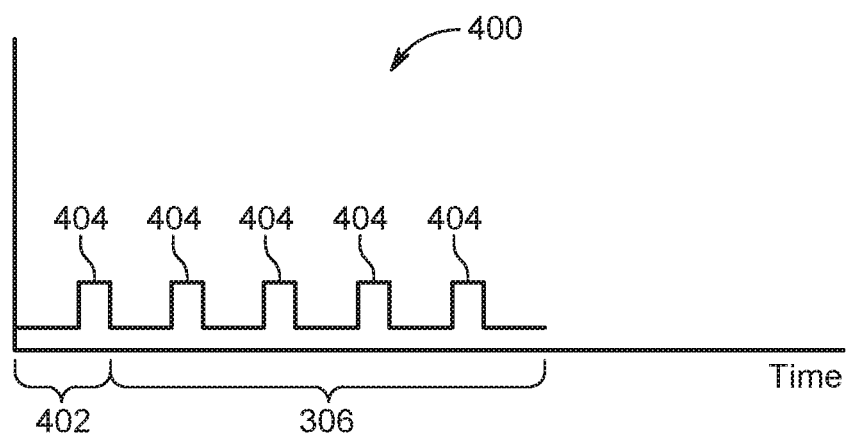
FIG. 4 illustrates a control signal having clock transitions in accordance with one or more embodiments of the present invention.

The BIST engine 110 may output a control signal 134 that is configured to control latches of the system 100. The control signal 134 includes clock transitions 404, as shown in FIG. 4, that actuate or operate the register latches 140, 146, 152, 158 and the aggregate latch 170. The control signal 134 may be disposed to operate the register latches 140, 146, 152, 158 and the aggregate latch 170. That is, the BIST engine 110 is configured to output the control signal 134 common to the register latches 140, 146, 152, 158 and the aggregate latch 170 such that the register latches 140, 146, 152, 158 and the aggregate latch 170 operate collectively. The BIST engine 110 may further be configured to send a reset signal to the register latches 140, 146, 152, 158 and the aggregate latch 170 at the end of the test cycle.

The register 130 may include NAND arrangements 164 configured to transition the error logic signals 138, in parallel, of the comparator 120 to the serial output 162. Those versed in the art will appreciate that other arrangements may convert the serial output 162. The NAND arrangements 164 can receive a write signal 132 depending on whether the register 130 is in a parallel receive mode, receiving error logic signals 138 from the comparator 120 or in a serial output mode, outputting the serial output 162. Portions of the write signal 132 may be inverted by inverter 136. The NAND arrangements 164 may include or draw from a feedback OR circuit to maintain error signals received throughout the current test cycle.

The system 100 includes repair circuitry 180. The repair circuitry 180 may be configured to receive an output from the aggregate latch 170, indicating that an error occurred on the memory array 102 during the test cycle with memory addresses 106 associated with the test. The repair circuitry 180 is operable to receive a memory address under test 186 from the BIST engine 110 over data bus 182. The repair circuitry 180 may be operable to store the memory address under test 186 in defective memory store 184. The repair circuitry 180 may be configured to disable the memory address under test 186 in cooperation with the memory array 102.

Figure 2:
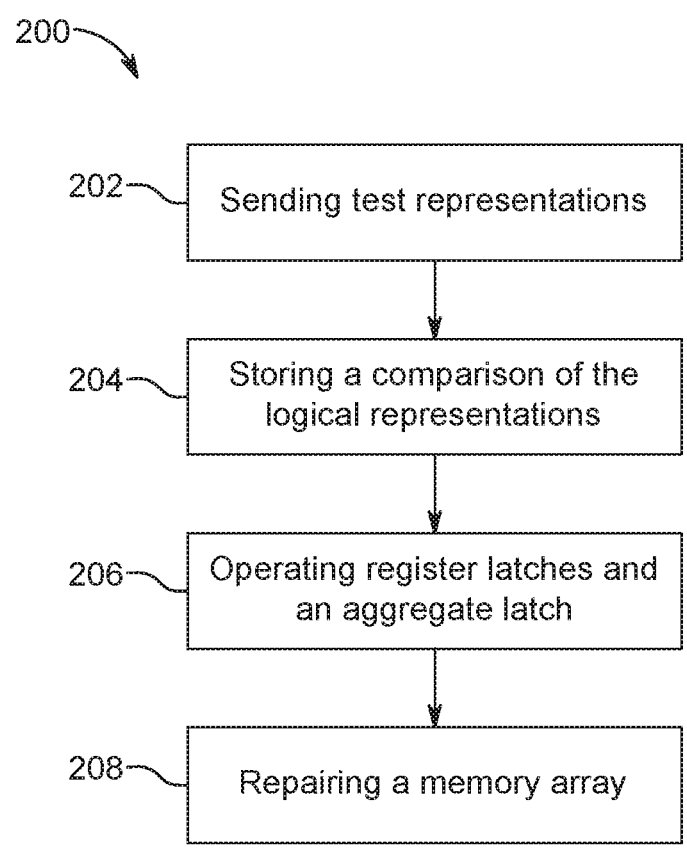
FIG. 2 illustrates a method of using a BIST engine to validate data written to a memory array in accordance with one or more embodiments of the present invention.

Referring to FIG. 2, a method 200 according to one or more embodiments of the present invention, is shown. The method 200 includes blocks or steps that define step-by-step process of implementing one or more portions of embodiments of the present invention and is described with reference to FIGS. 1-3. In block 202, test representations 116 are sent to a memory array 102. The test representations 116 include respective first states 302 or second states 304. The first states 302 may be a TRUE or FALSE logic. The second states 304 may be TRUE or FALSE logic. The memory array 102 may store the test representations 116 in the memory cells 104 or attempt to store the test representations 116 in the memory cells 104 according to the memory addresses 106 relevant to current test cycle.

In block 204, a comparison of the test representations 116 and the logical representations 118 is performed. The comparison may be a bitwise comparison. The comparison in block 204 may be performed by XOR circuitry or any other implement.

In block 206, the register latches 140, 146, 152, 158 may be operated. The register latches 140, 146, 152, 158 may be operated according to the control signal 134. The register latches 140, 146, 152, 158 may shift the error logic signals 138 to the serial output 162. The aggregate latch 170 may receive the serial output 162. The aggregate latch 170 may be operated according to the control signal 134.

In block 208, the repair circuitry 180 may repair the memory array 102. The memory array 102 may be repaired according to the output of the aggregate latch 170. The repairing of block 208 may include disabling the memory address or memory addresses under test 186 associated with the defective memory store 184.

Referring to FIG. 3, a timing diagram 300 is shown in accordance with one or more embodiments of the present invention. The timing diagram 300 includes the control signal 134, and the stored error logic signals 138 in the register latches 140, 146, 152, 158 and the aggregate latch 170. As shown, the control signal 134 includes clock transitions 404, as shown in FIG. 4, performed over a second cycle 306 having a second duration. The control signal 134 operates the register latches 140, 146, 152, 158 and the aggregate latch 170 to shift the stored error logic signals 138 to the aggregate latch 170 through the serial output 162. One example, as shown, includes register latch 140 having a second state 304 at the outset. The register latch 140 passes the second state 304 to register latch 146, which starts with a first state 302 at the outset. The register latch 152 starts with a second state 304 at the outset and passes both second states 304 to register latch 158. Aggregate latch 170 is configured to maintain the first state 302, as shown, until it receives a second state 304 from the serial output 162 associated with register latch 158.

Referring to FIG. 4, a timing diagram 400 is shown according to one or more embodiments of the present invention. The timing diagram 400 includes clock transitions 404. The clock transitions 404 may originate from the BIST engine 110. The clock transitions 404 may be associated with a first cycle 402 having a first duration and a second cycle 306 having a second duration. The clock transitions 404 organize operation of the system 100. The first cycle 402 completes before the second cycle 306 is performed. The second cycle 306 completes before the first cycle 402 is repeated. The first cycle 402 and the second cycle 306 may be repeated over multiple iterations of the first cycle 402 and the second cycle 306. The clock transitions 404 during the first iteration of the first cycle 402 and the second cycle 306 may be greater in quantity than a quantity of the register latches 140, 146, 152, 158.

Those versed in the art will readily appreciate that the vectors and data discussed herein may include any number of bits having logical values or digital values that define the data. The data may be an array or other designation of data organization and structure. The data may correspond to several communications channels or bit paths configured to transmit logical data within the vector or array. Such communications, bit paths, or bit channels may be unique or multiplexed to propagate the proper data to the respective destination.

Circuitry refers to any combination of logic, wires, fundamental components, transistors, diodes, latches, switches, flip-flops, half-adders, full-adders, carry-save adders, or other implements, that may be arranged to carry the intended output or disclosed operations.

Various embodiments of the invention are described herein with reference to the related drawings. Alternative embodiments of the invention can be devised without departing from the scope of this invention. Various connections and positional relationships (e.g., over, below, adjacent, etc.) are set forth between elements in the following description and in the drawings. These connections and/or positional relationships, unless specified otherwise, can be direct or indirect, and the present invention is not intended to be limiting in this respect. Accordingly, a coupling of entities can refer to either a direct or an indirect coupling, and a positional relationship between entities can be a direct or indirect positional relationship. Moreover, the various tasks and process steps described herein can be incorporated into a more comprehensive procedure or process having additional steps or functionality not described in detail herein.

In an exemplary embodiment, the methods described herein can be implemented with any or a combination of the following technologies, which are each well known in the art: a discrete logic circuit(s) having logic gates for implementing logic functions upon data signals, an application specific integrated circuit (ASIC) having appropriate combinational logic gates, a programmable gate array(s) (PGA), a field programmable gate array (FPGA), etc.

Additionally, the term "exemplary" is used herein to mean "serving as an example, instance or illustration." Any embodiment or design described herein as "exemplary" is not necessarily to be construed as preferred or advantageous over other embodiments or designs. The terms "at least one" and "one or more" may be understood to include any integer number greater than or equal to one, i.e. one, two, three, four, etc. The terms "a plurality" may be understood to include any integer number greater than or equal to two, i.e. two, three, four, five, etc. The term "connection" may include both an indirect "connection" and a direct "connection."

The terminology used herein is for the purpose of describing particular embodiments only and is not intended to be limiting of the invention. As used herein, the singular forms "a", "an" and "the" are intended to include the plural forms as well, unless the context clearly indicates otherwise. It will be further understood that the terms "comprises" and/or "comprising," when used in this specification, specify the presence of stated features, integers, steps, operations, elements, and/or components, but do not preclude the presence or addition of one or more other features, integers, steps, operations, elements, components, and/or groups thereof.

The corresponding structures, materials, acts, and equivalents of all means or step plus function elements in the claims below are intended to include any structure, material, or act for performing the function in combination with other claimed elements as specifically claimed. The description of the present invention has been presented for purposes of illustration and description but is not intended to be exhaustive or limited to the invention in the form disclosed. Many modifications and variations will be apparent to those of ordinary skill in the art without departing from the scope and spirit of the invention. The embodiments were chosen and described in order to best explain the principles of the invention and the practical application, and to enable others of ordinary skill in the art to understand the invention for various embodiments with various modifications as are suited to the particular use contemplated.

Aspects of the present invention are described herein with reference to flowchart illustrations and/or block diagrams of methods, apparatus (systems), and computer program products according to embodiments of the invention. It will be understood that each block of the flowchart illustrations and/or block diagrams, and combinations of blocks in the flowchart illustrations and/or block diagrams, can be implemented by computer readable program instructions.

The instructions disclosed herein, which may execute on the computer, other programmable apparatus, or other device implement the functions/acts specified in the flowchart and/or block diagram block or blocks.

The flowchart and block diagrams in the Figures illustrate the architecture, functionality, and operation of possible implementations of systems, methods, and computer program products according to various embodiments of the present invention. In this regard, each block in the flowchart or block diagrams may represent a module, segment, or portion of instructions, which comprises one or more executable instructions for implementing the specified logical function(s). In some alternative implementations, the functions noted in the blocks may occur out of the order noted in the Figures. For example, two blocks shown in succession may, in fact, be executed substantially concurrently, or the blocks may sometimes be executed in the reverse order, depending upon the functionality involved. It will also be noted that each block of the block diagrams and/or flowchart illustration, and combinations of blocks in the block diagrams and/or flowchart illustration, can be implemented by special purpose hardware-based systems that perform the specified functions or acts or carry out combinations of special purpose hardware and computer instructions.

The descriptions of the various embodiments of the present invention have been presented for purposes of illustration but are not intended to be exhaustive or limited to the embodiments disclosed. Many modifications and variations will be apparent to those of ordinary skill in the art without departing from the scope and spirit of the described embodiments. The terminology used herein was chosen to best explain the principles of the embodiments, the practical application or technical improvement over technologies found in the marketplace, or to enable others of ordinary skill in the art to understand the embodiments disclosed herein.

What is claimed is:

1. A system for testing a memory array having self-test circuitry, the system comprising:
    a register comprising a plurality of register latches operable to receive a plurality of error logic signals having respective first states or second states, the register latches being arranged in series respectively having a plurality of latch inputs cascaded with a plurality of preceding latch outputs operable to shift the error logic signals according to a control signal that is common to the register latches to a serial output as a first state or second state based on the error logic signals;
    an aggregate latch operable to receive the serial output and having input logic configured to maintain the first state within the aggregate latch until the serial output is the second state; and
    a built-in self-test (BIST) engine comprising a plurality of stored instructions operable upon execution by the BIST engine to output the control signal.

2. The system of claim 1, further comprising the memory array comprising a plurality of memory cells configured to retain logical representations,
    wherein the error logic signals correspond to errors of the memory array and the stored instructions are further operable upon execution by the BIST engine to send the test representations to the memory array during a first cycle and send the control signal during a second cycle.

3. The system of claim 2, wherein a first duration of the first cycle is greater than a second duration of the second cycle.

4. The system of claim 2, further comprising comparator circuitry configured to compare the logical representations from the memory array and test representations from the BIST engine and output the error logic signals to the register latches corresponding with respective memory cells, wherein the stored instructions are further operable upon execution to send the test representations to the comparator circuitry.

5. The system of claim 4, wherein the clock transitions are greater in quantity than a quantity of the register latches during one iteration.

6. The system of claim 1, wherein the control signal comprises a plurality of clock transitions configured to operate the register latches and the aggregate latch.

7. The system of claim 1, wherein the input logic is an OR gate having a feedback loop from an aggregate latch output of the aggregate latch and an aggregate serial input.

8. The system of claim 7, wherein the aggregate latch is configured to maintain the second state until a reset.

9. The system of claim 1, wherein the aggregate latch is configured to receive the control signal.

10. The system of claim 1, wherein the aggregate latch comprises an aggregate latch output associated with the aggregate latch, and
    further comprising repair circuitry associated with the memory array configured to receive a memory address under test from the BIST engine associated with memory cells of the memory array under test and the aggregate latch output.

11. The system of claim 1, wherein the register is operable to receive the error logic signals in parallel, and the stored instructions are further operable upon execution by the BIST engine to enable parallel writing of the register.

* * * * *